INVENTOR
ROBERT DELIGNIERES
BY Craig & Antonelli
ATTORNEYS

INVENTOR
ROBERT DELIGNIERES

BY Craig & Antonelli
ATTORNEYS

March 24, 1970 R. DELIGNIERES 3,503,008

PHASE MODULATION OSCILLATOR

Filed April 25, 1968 3 Sheets-Sheet 3

INVENTOR

ROBERT DELIGNIERES

BY Craig & Antonelli

ATTORNEYS

United States Patent Office 3,503,008
Patented Mar. 24, 1970

3,503,008

PHASE MODULATION OSCILLATOR

Robert Delignieres, Colombes, France, assignor to Institut Francais du Petrole, des Carburants et Lubrifiants, Rueil-Malmaison, Hauts-de-Seine Filed Apr. 25, 1968, Ser. No. 724,088
Claims priority, application France, May 2, 1967, 104,976
Int. Cl. H03b 5/02
U.S. Cl. 331—117 6 Claims

ABSTRACT OF THE DISCLOSURE

An oscillator including a transistor having an oscillating circuit connected with its collector electrode and a decoupling capacitance connected with its emitter electrode. A control voltage is applied to the base electrode of the transistor, this voltage having a first value corresponding to a conductive state of the transistor and a second value smaller than the first value, corresponding to a reduced intensity of the emitter current, this intensity being however different from zero. This second value is adapted to generate in the oscillating circuit oscillations which are sustained by a feedback coupling provided mainly by the internal base-collector capacitance of the transistor.

Figure 1:
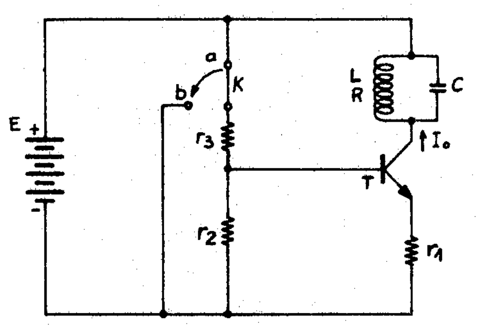

The present invention has for its object a self-sustained oscillator providing oscillations of very stable amplitude and the starting and stopping control of which is not accompanied by any transient parasitic oscillation, its oscillation beginning moreover at a fixed phase.

The oscillator according to the invention, of particularly simple structure, is suitable for numerous applications, for example in time-measuring devices (specially in the radar technique), in the modulating circuits of transmitting devices (radio, radar, sonar), in the circuits of analog computers, in devices for remote metering (multiplexing), the preceding list being moreover not limitative.

The oscillator according to the invention is particularly adapted for pulse modulation.

The problem solved by the invention is that of providing an oscillator presenting all the above-indicated qualities.

Among the simplest conventional oscillators, the one which is often designated by "ringing circuit," essentially includes a transistor associated with a source of direct electric voltage, with the terminals of which the transistor emitter, base and collector electrodes are respectively connected through biasing resistances.

The collector circuit of this transistor includes an oscillating or resonant circuit and switching means adapted to switch the oscillator, by varying the polarity of the voltage applied ot the transistor base elecrode, from a first state, wherein the inductance of the oscillating circuit is traversed by a direct current, supplied by said electric source, to a second state, wherein the conduction of the transistor is suppressed and the oscillating circuit is then traversed by oscillations having a frequency substantially equal to the tuning frequency of this circuit.

Such an oscillator exhibits on the one side of the drawback consisting of a decrease of the amplitude of the oscillations as a function of time and, on the other hand, the drawback resulting from the formation of transient parasitic pulses, when the circuit is switched back from its second state to its first state corresponding to the interruption of the ocsillations and also at the starting control of these oscillations.

It is possible to obviate the first of the above-mentioned drawbacks by combatting agaist the energy losses which result in the dampening of the oscillation.

Some of the circuits which have been previously proposed for this purpose comprise the connection, in parallel with the oscillating circuit, of an element exhibiting, under the conditions of operation, a negative resistance, the value of which exactly compensates for the ohmic resistance of this oscillating circuit, such an element being for example a tunnel diode or an unijunction transistor. Other circuits, such as the Hartley or Colpitts oscillators, incude a reaction or feedback loop, i.e. a fraction of the oscillation appearing in the oscillating circuit is applied or fed back to the base circuit of the transistor.

These circuits correspond however to a complication of the basic oscillator circuit and moreover only supress the first of the above-indicated drawbacks (damping of the oscillation), without suppressing the transient parasitic oscillations which are produced, in particular, at the stopping control of the oscillations.

With these prior circuits it is only possible to reduce these transient disturbances, at the cost of fastidious adjustments, whereas the full cancellation of these parasitic oscillations can only be obtained by further increasing the complexity of the circuit, so as to obtain a perfect synchronization between, on the one hand, the instants of starting and stopping the oscillation and, on the other hand, the instants of passage through zero of this oscillation.

The present invention permits it to perfectly and simultaneously eliminate all the above-indicated drawbacks of an oscillator of the considered type and this without substantially increasing the complexity of this oscillator, but simply by a particular selection of some elements of this oscillator, in combination with a different way of controlling the actuation and the stopping of this oscillator.

An oscillator according to the invention includes at least one transistor the collector electrode of which is connected with an oscillating circuit, at least one source of direct electric voltage with the terminals of which the emitter, the base and the collector electrodes of the transistor are respectively connected through biasing impedances, in association with means for applying a control voltage to the transistor base electrode, this means being adapted to switch this control voltage from a first value thereof corresponding to a conducting state of the transistor to a second value, said second value having a magnitude smaller than that of said first value and being adapted to initiate electric oscillations in said oscillating circuit. According to the invention the emitter circuit of the transistor includes a decoupling capacitor and said second value of the control voltage has the same polarity as said first value and is selected, as a function of said capacitor, so as to correspond to a reduced value, which is however different from zero, of the transistor emitter current, and to give the internal base-collector capacitance of the transistor a value which corresponds to the production in the oscillating circuit of oscillations sustained by a reaction or feedback circuit which is mainly constituted of said internal capacity.

In a preferred embodiment of the invention the first value of the control voltage applied to the transistor base electrode is selected substantially equal to the biasing voltage of the transistor collector electrode, provided by said source of voltage, and the transistor emitter electrode is connected with a biasing resistance having the value $$R_1 = \sqrt{\frac{L}{C}}$$

where L and C are the respective values of the inductance and capacitance of the oscillating circuit.

This provision results in the beginning of the oscillations being free of any parasitic transient oscillations.

It will be possible to use a two-transistor oscillator in which one of the transistors provides an auxiliary feed-back coupling which, added tothe main feed-back coupling constituted of the internal base-collector capacitances of the other transistor, futrher increases the amplitude stability of the oscillations and specially gives the oscillator a greater facility of adaptation to a change in its tuning frequency and to a change in the load of the electronic stages connected with the output terminals of this oscillator.

Figures 2A, 2B:
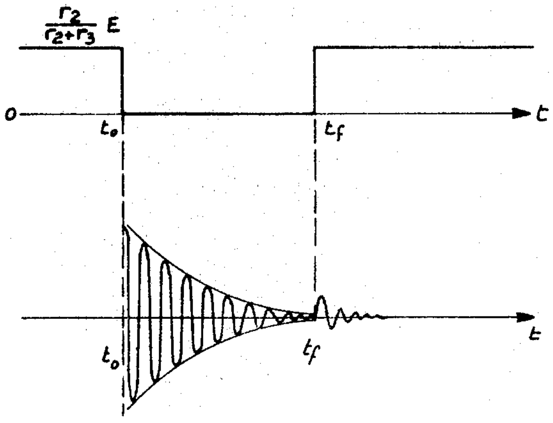
Figure 3:
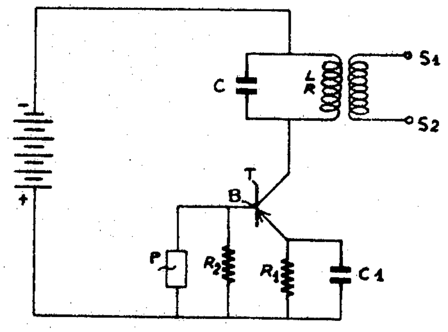
Figures 4A, 4B:
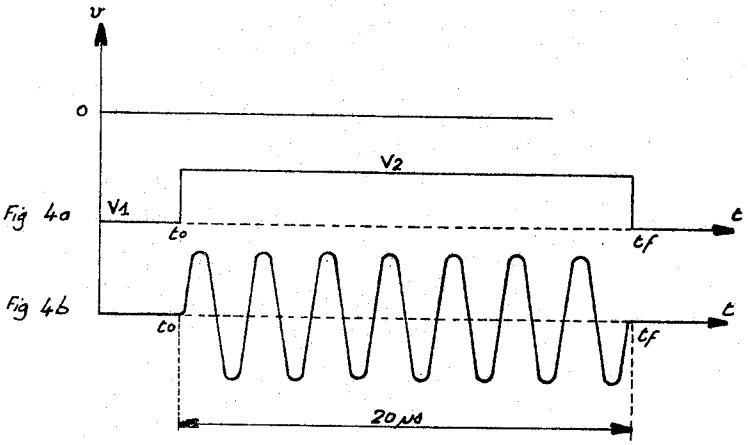
Figure 5:
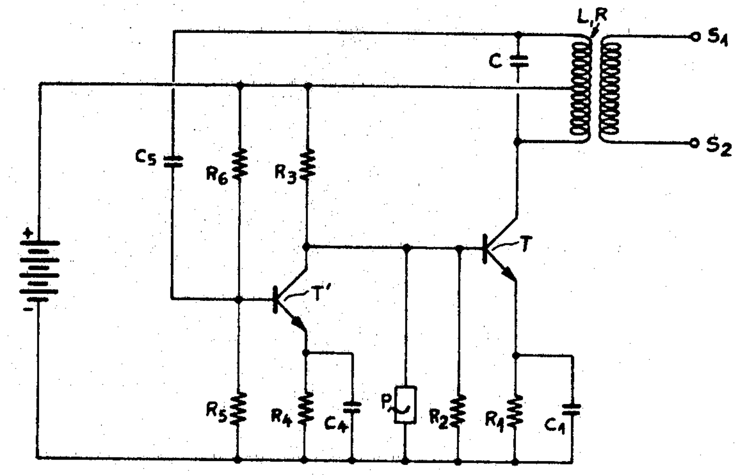
Figure 6:
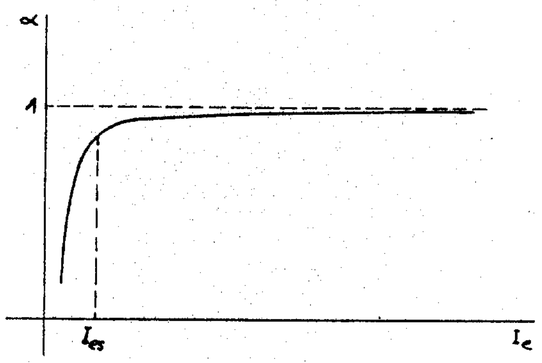

The invention will be described hereinafter more in detail, with reference to the attached drawings wherein:

FIGURE 1 illustrates a conventional oscillator,

FIGURE 2*a* illustrates the usual way of controlling this oscillator and shows, as a function of time, the electric voltage applied to the transistor base electrode, FIGURE 2*b* shows the shape of the wave train which is obtained with this conventional device, FIGURE 3 diagrammatically illustrates a first embodiment of an oscillator according to the invention, FIGURE 4*a* illustrates the way of controlling this oscillator, FIGURE 4*b* shows an example of an oscillation train which can be obtained with this oscillator, FIGURE 5 shows an embodiment of an oscillator according to the invention, having a high stability and which can be used for a wide range of frequencies and a wide range of loads of the electronic stages following this oscillator and FIGURE 6 illustrates the variations in the current gain of the transistor as a function of the intensity of the emitter current.

In the following is first described the operation of an oscillator of a known type ringing circuit, diagrammatically illustrated by FIG. 1, so as to point out the drawbacks of this conventional circuit, the removing of these drawbacks constituting the object of the present invention.

The oscillator includes an oscillating circuit, which is conventionally defined by its inductance L, its resistance R and its capacitance C, a transistor T, biasing resistances $r_1$, $r_2$ and $r_3$, a source of direct current, the terminals of which are indicated by + and — and a switch K having two positions *a* and *b*.

If the switch is placed on *a*, the base of the transistor T is brought to the potential $$\frac{r_2}{r_1+r_2}\cdot E$$

(FIG. 2*a* where *t* designates the time) E being the voltage at the terminal + of the direct current generator and T supplies the current $I_o$ through the oscillating circuit L, R, C.

By placing at the instant $t_0$ the switch onto *b*, the transistor is suddenly blocked.

The potential energy stored by the inductance L and which is substantially equal to $\frac{1}{2}LI_o^2$ is alternately exchanged between this inductance and the condenser C.

Oscillations are generated which are progressively damped as a result of the energy looses of the circuit (since this circuit always exhibits a resistance R which is heated by the current and also because of the energy losses of the oscillating circuit through coupling with other elements of the oscillator and of the energy losses through the dielectric material of the condensator C).

The amplitude $E_m$ of the alternative electromotive force generated in the oscillating circuit thus decreases exponentially as a function of time, following the law $$E_m+E_{mo}e-\frac{2\pi f_o}{2Q}(t-t_o)$$

(FIG. 2*b*), where $f_o$ is the tuning frequency of the circuit, $$f_o=\frac{1}{2\pi\sqrt{LC}}$$

*t* is the time and Q a coefficient called the quality factor of the icrcuit, expressing the energy losses of the circuit, $E_{mo}$ is the amplitude of the alternative electromotive force generated in the oscillating circuit at the instant $t_o$.

As a result of the decrease of the oscillation amplitude as a function of time, such an oscillator, in the embodiment shown by FIG. 1, can only be used for short intervals of oscillation (a few periods).

The oscillation frequency is moreover not equal to the tuning frequency $$f_o=\frac{1}{2\pi\sqrt{LC}}$$

its real value being $$f=f_o\sqrt{1-\left(\frac{1}{2Q}\right)^2}$$

The above-described oscillator has essentially the two already indicated drawbacks.

The first of these drawbacks is the dampening of the oscillation as hereinabove indicated The second is the existence of transient phenomena which are expressed by parasitic oscillations, particularly at the instant $t_f$ when the switch is again placed onto the position *a*, which corresponds to the stopping of the oscillations.

According to the invention these two drawbacks are simultaneously suppressed without any substantial complication of the basic structure of the conventional oscillator which has been described hereinabove.

A first embodiment of an oscillator according to the invention is shown by FIG. 3.

In this embodiment, the transistor is of the PNP type, but it must be understood that it is also possible to use a transistor of the NPN type (as in the embodiment according FIGURE 5), by reversing the polarities of the direct current source connected with the transistor.

The diagram of FIG. 3 includes most of the elements constituting the conventional circuit of FIG. 1.

P designates switching means permitting to switch the voltage of the base electrode B of the transistor from a first to a second hereinunder defined values and vice versa.

P may for example be constituted of a pulse-controlled multivibrator, which can at will deliver two sorts of electric voltages on its output terminal which is connected with the base electrode B of the transistor T.

The switching means P may also be constituted of any other electronic or electromechanical device (two-way switch, stop switch etc.) which can vary the base voltage of the transistor from one to the other of the two hereinunder-indicated values $V_1$ and $V_2$.

The switching device P can change the base voltage of the transistor from the first value $V_1$ substantially equal to the collector voltage of this transistor, for example —12 volts in the illustrated embodiment (see FIG. 3, 4*a* and 4*b*) to the second value $V_2$ ($V_2=-1$ volt, for example) corresponding to a very low (but not equal to zero) current in the collector circuit (there is thus no blocking of the transistor conduction, contrarily to what occurs in the conventional circuit of FIG. 1). This switching is performed at the instant $t_o$ on the diagrams of FIGS. 4*a* and 4*b*.

It has been discovered that under these conditions it is possible to adjust the decoupling capacitance $C_1$ of the transistor emitter electrode, so as to provide for sustained or self-supporting oscillations in the circuit L, R, C, without adding any other element to the circuit of FIG. 3.

This result can be explained considering that for said second value $V_2$ of the base voltage to which corresponds the base-collector capacitance $C_{b'c}$ of the transistor, and a small value of the current intensity in the emitter circuit of this transistor, it is possible to adjust the internal capacitance of the transistor emitter electrode so as to provide oscillation in the circuit L, R, C, these oscillations being sustained by a feedback through the internal capacitance $C_{b'c}$ of the transistor, between collector and base.

In other words, the oscillator according to the invention illustrated by FIG. 3, operates in its oscillating phase as an oscillator having two dephasing circuits simultaneously providing a phase lag and a phase lead respectively, the sustained oscillation being not obtained by providing the conventional circuit of FIG. 1 with any additional capacitive reaction or feedback loop connected between collector and base, but by using for sustaining the oscillations the only internal capacitance of the transistor between base and collector electrode without adding any reaction or feedback elements external to the transistor.

When the reverse switching of the device P is achieved at the instant $t_f$ (FIGS. 4*a* and 4*b*), the voltage of the transistor base B is brought back to the value $V_1$ and the capacity collector-base $C_{b'c}$ of the transistor being modified, the oscillations are stopped.

As hereinunder indicated, by giving $V_2$ an absolute value as small as possible (and most of time not exceeding 1 volt), compatible with a good current amplification of the transistor, it is possible to obtain that the stopping of the oscillations, by bringing back the base potential to the value $V_1$ is effected without producing any transient control oscillations.

The starting or stopping control of the oscillator according to the invention thus provides for a variation in the internal capacity base-collector of the transistor and hence for a variation in the respective phases of the different elements of the circuit, between a state wherein the mutual phase relations between these currents provide for oscillations in the circuit L, R, C and a state where the respective phases of these currents do not coincide any more as a result of the variation in the internal capacity $C_{b'c'}$ so that the oscillations are stopped.

The oscillator according to the invention may thus be called a phase modulation oscillator.

It has moreover been discovered that the beginning of the oscillations at the instant $t_o$ will occur without transient parasitic modulations of the first peaks of the oscillation if the voltage $V_1$ (rest voltage) is selected substantially equal to the collector voltage and if at the same time the biasing resistance $R_1$ of the emitter electrode is selected substantially equal to $\sqrt{L/C}$, where L and C are the respective values of the inductance and of the capacitance of the oscillating circuit, these values being furthermore interconnected by the relation $$4\pi^2 LCf^2 = 1$$

where *f* is the selected oscillation frequency.

These results may be explained by considering that if the maximal amplitude $E_{mo}$ of the alternating electromotive force produced by the oscillation in the circuit L, R, C is selected at least equal to the biasing voltage $V_c$ of the collector, the transient parasitic oscillations of greater amplitude which may be generated at the instant $t_o$ are clipped by a saturation phenomenon of the transistor collector.

As already indicated hereinabove, we have the relation $$E_{mo} = I_o \sqrt{\frac{L}{C}}$$

where $I_o$ is the intensity of the direct current supplied by the collector electrode to the circuit L, R, C before the instant of starting the oscillations.

Assuming that $E_{mo} = V_c$, there is obtained $$I_o = V_c \sqrt{\frac{C}{L}} \qquad (2)$$

Furthermore $$I_c \cong \frac{V_1}{R_1} \qquad (3)$$

since the value of the amplification factor of the transistor is not very different from the unit.

It is known that the current gain of a transistor $$\alpha = \frac{\Delta I_c}{\Delta I_e}$$

which represents, for a fixed base voltage, the variation of the current in the collector circuit, in relation to the corresponding variation of the emitter current, is not much smaller than the unit, irrespective to the value of the current $I_e$ in the emitter above a certain threshold value of this current, as shown by FIG. 6: the curve representing the coefficient $\alpha$ of a transistor as a function of the emitter current, exhibits a bend at the point corresponding to the value $I_{es}$ and the value of the coefficient $\alpha$ abruptly decreases for $I_e < I_{es}$.

By giving the base voltage $V_1$ in the rest state of the oscillator a value substantially equal to $V_c$ which is the collector voltage, it has been experimentally ascertained that a very steep oscillation front was obtained at the instant to, without any transient parasitic oscillations before the beginning of the oscillation itself.

Assuming that $$V_1 = V_c \qquad (4)$$

($V_c$ collector voltage), the relation (3) becomes in a first approximation $$I_o = \frac{V_c}{R_1} \qquad (3')$$

If it is desired that the relation (3) be also complied with, in order to avoid a parasitic modulation of the first oscillation peak, there is obtained, by considering the relations (2) and (3')

$$R_1 = \sqrt{\frac{L}{C}} \qquad (5)$$

An oscillator according to the invention, by complying with the conditions (4) and (5), permits to obtain at the instant $t_o$ of the beginning of the oscillations (FIGS. 4*a* and 4*b*) both the absence of any parasitic modulation of the first peaks of this oscillation and of transient oscillations therebefore.

Furthermore, as already indicated hereinabove, the voltage $V_2$ is so selected as to correspond to a value as small as possible of the current intensity in the emitter circuit of T, compatible with a good current amplification of the transistor. This value will preferably be substantially equal to $I_{es}$, corresponding (FIG. 6) to the bend of the curve of variation of the coefficient $\alpha$ as a function of the emitter current, which will lead to select substantially $$V_2 = I_{es} R_1$$

The absence of transient impulses at the instant $t_f$ of stopping the oscillations, obtained when $V_2$ is substantially equal to $R_1 I_{es}$ and $V_1$ is close to the collector voltage, may be explained considering that there is thus obtained the maximal possible variation of the current in the emitter circuit at the instant of switching, the internal base-collector capacity varying at the instant $t_f$ of stopping the oscillations from a low value $(C_{b'c})_2$ corresponding to the value $V_2$ of the base voltage to a distinctly higher value $(C_{b'c})_1$ (which is for example five times higher than the first one without however most of time exceeding 100 pf.) for the value $V_1$ of the voltage of the transistor base (parametric action).

The transient oscillations produced at the instant $t_f$ and corresponding to the energy stored in the base-collector capacity $C_{b'c}$ of the transistor and the amplitude of which is proportional to the square root of the quotient of the energy stored by the base-collector capacity (usual formula $W = \frac{1}{2}CV^2$ for a condensator having the capacity C and the loading voltage of which is V). The increase in the capacity base-collector at the instant $t_f$ thus results in a reduction by the factor $$\sqrt{\frac{(C_{b'c})_2}{(C_{b'c})^1}}$$

of the amplitude of the parasitic oscillations which could be generated at this instant with respect to the value which would be that of this amplitude if the capacity $C_{b'c}$ should keep at the instant $t_f$ its value $(C_{b'c})_2$ sustaining the oscillations.

The following simplified calculations permit to determine, at least in a first approximation, some of the elements of the oscillator illustrated by FIGURE 3.

The base voltage $V_b$ of the transistor complies with the relation $$V_B=\frac{V_C \cdot R_B}{Z_B}$$

where $V_C$ is the collector voltage, $R_B$ the base resistance ($R_B=R_2$ in the oscillator of FIG. 3) and $Z_B$ is the impedance equivalent to the assembly of the base resistance and of the capacity $C_{b'c}$ which are connected in series.

The current intensity in the transistor emitter is substantially equal to $$I_E=\frac{V_B}{Z_1}=\frac{V_C R_B}{Z_1 Z_B}$$

where $Z_1$ is the impedance equivalent to the resistance $R_1$ and the condensator $C_1$ connected in parallel.

The value of the current intensity in the collector is $$I=-\alpha I_E,$$

$\alpha$ being the current gain of the transistor.

It results therefrom that $$I_c=-\frac{\alpha V_c \cdot R_B}{Z_1 \cdot Z_B}$$

And hence the impedance in the collector circuit of the transistor between the terminals of the oscillating circuit is substantially equal to $$Z=\frac{V_c}{I_c}=-\frac{Z_1 \cdot Z_B}{\alpha R_B}$$

Using the conventional complex notations it is possible to write $$Z_B=R_B+\frac{1}{jC_{b'c}\omega} \text{ and } Z_1=\frac{R_1}{1+jR_1C_1\omega}$$

where $\omega$ is the current pulsation in the collector circuit of transistor.

The condition of resonance for the value $C_{b'c}$ of the capacity base-collector of the transistor, corresponding to the value $V_2$ of the base potential necessitates that the real component of Z be equal to $-I/RC$ so as to constiute a "negative resistance" connected in parallel with the oscillating circuit, and having the same absolute value as the internal impedance of the latter and that its imaginary component be equal to zero, which, by introducing the two above expressions of $Z_1$ and $Z_2$ into the relation (6) gives the two following relations $$\frac{C_1 L}{RC}=\frac{\alpha C_{b'c} R_B}{R_1^2} \quad (9)$$

and $$C_1=\frac{1}{C_{b'c} R_1 R_B \omega^2} \quad (10)$$

or $$C_1=\frac{LC}{R_1 R_B C_{b'c}}$$

neglecting the value of $C_{b'c}$ (which does not exceed 100 pf.) with respect to the capacity $C_1$.

The value of the base resistance $R_B$ of the transistor is generally selected between 1 and 5 kΩ.

By fixing as indicated above the base voltage $V_2$ for the oscillating position ($|v_2|\leq 1$ volt) and taking into account the relations $$R_1=\sqrt{L/C} \text{ and } LC\omega^2=1,$$

the above relations (9) and (10) permit to determine all the elements of the circuit of FIG. 3.

In the oscillator according to the invention illustrated by FIG. 3 $S_1$ and $S_2$ designate the output terminals on which are collected the oscillation.

As already indicated, the transistor T provides in its collector circuit, for the value $V_2$ of its base voltage, a negative resistance in parallel to the oscillating circuit and there must be an exact compensation between this resistance and the known impedance of the oscillating circuit for providing the oscillation $$\left(R_N=-\frac{L}{RC}\right)$$

In order to decrease the impedance $L/RC$ of the circuit, thereby permitting to use the oscillator for a wider frequency range and a wider range of loads of the the electronic circuits connected with the output terminals $S_1$ and $S_2$ of the oscillator, it will be advantageous to provide the circuit of FIG. 3 with an additional reaction or feedback loop, this feedback loop being so designed as to introduce between the terminals of the oscillating circuit, in parallel with this circuit, a negative resistance $R'_N$ which gives a resultant with $R_N$.

The condition of oscillation is obtained by writing that the resistance equivalent to the two resistances $R_N$ and $R'_N$ connected in parallel is equal to $-L/RC$ $$\frac{R'_{N'} \cdot R_N}{R_N+R'_N}=-\frac{L}{RC}$$

The absolute value of this equivalent resistance being smaller than that of $R_N$ it can be seen that it is really possible in that way to obtain a reduction of the impedance $L/RC$ of the oscillating circuit, with respect to the embodiment according to FIG. 3.

The above relation shows that this supplementary feedback loop must be so determined that $$|R_{N'}|>\frac{L}{RC}$$

By way of example, the oscillator according to the invention illustrated by FIG. 5 is provided, in addition to the constituents of the preceding oscillator, with an additional feedback loop.

The effect of this additional feedback or reaction is so selected as to be insufficient for sustaining by itself the oscillation, but permits to obtain a make-up feedback added to the feedback produced by the self-capacitance $C_{b'c}$ of the transistor T for the above-defined voltage $V_2$ of the base of this transistor.

This make-up feedback further increases the stability of the generated oscillations but specially provides an oscillator which can be used for wide ranges of frequencies and loads of the electronic circuits connected with the output terminals $S_1$ and $S_2$ of the oscillator.

The supplementary feedback loop of this oscillator includes a second transistor T' which receives on its base electrode through the coupling condensator $C_5$, the signal appearing in the oscillating circuit (L, R, C).

The transistor T' is provided with the biasing resistances $R_3$, $R_4$, $R_5$ and $R_6$, the biasing resistance $R_4$ of the emitter circuit of T' being decoupled in a conventional way, through the condensator $C_4$.

In the circuit of FIG. 5, the source of biasing direct current is connected with the middle point of the inductance L of the oscillating circuit L, R, C, while the feedback loop connects with the base of the transistor T' the terminal of this oscillating circuit which is opposed to that connected with the collector electrode of T.

In order to give the oscillator shown by FIG. 5 a higher stability, specially with respect to temperature variations, it will be advantageous, so as to give the biasing voltage of the base electrode of the transistor T a well-defined value, for each of the two above-defined states $V_1$ and $V_2$, that the biasing direct current of this base, passing through the two resistances $R_2$ and $R_3$ connected in series between terminals of the current source and proportional to $$\frac{1}{R_2+R_3}$$

be much higher than the one applied to the base of this transistor T through the transistor T', this last-mentioned current being substantially proportional to $$\frac{R_5}{R_5+R_6}\cdot\frac{1}{R_4}, \text{ since } \frac{R_5}{R_5+R_6}$$

defines the voltage of the base of transistor T'.

This leads to the condition $$\frac{1}{R_2+R_3} \geq \frac{R_5}{R_4(R_5+R_6)}$$

By way of illustration, an oscillator according to the invention, like the one illustrated by FIGURE 5, has provided oscillations the frequency of which does not vary by more than one thousandth within a frequency range between 5 kHz. and 250 kHz., this frequency range being however by no way limitative.

What is claimed is:

1. Oscillator including at least one transistor the collector of which is connected with an oscillating circuit, at least one source of direct electric voltage with the respective terminals of which the emitter, the base and the collector electrodes of said transistor are connected through biasing impedances, in association with means for applying a control voltage to the transistor base electrode, whereby this voltage can be switched from a first value corresponding to a conductive state of the transistor, to a second value the magnitude of which is smaller than that of said first value, the switching to said second value initiating electric oscillations in said oscillating circuit, wherein said emitter circuit of the transistor is provided with a decoupling capacitance and said second value of the control voltage is so selected as a function of this capacitance as to correspond to a reduced value, different from zero of the emitter current of said transistor, and to give the internal base-collector capacitance of the transistor a value corresponding to the production in said oscillating circuit of oscillations sustained by a feedback circuit which is mainly constituted of said internal capacity.

2. Oscillator in accordance with claim 1, wherein said first value of said control voltage applied to the transistor base electrode is selected substantially equal to the biasing voltage of the collector electrodes of said transistor by said voltage source and wherein the transistor emitter electrode is connected with a biasing resistance having the value $$R_1=\sqrt{\frac{L}{C}}$$

where L and C are the respective values of the inductance and of the capacitance of said oscillating circuit.

3. Oscillator in accordance with claim 1, wherein said second value of said control voltage is so selected that the current intensity in the emitter circuit of the transistor for said second value of the control voltage substantially corresponds to the bend of the curve which represents the current gain $$\alpha=-\frac{\Delta I_c}{\Delta I_e}$$

of the transistor as a function of the current intensity in the emitter circuit.

4. Oscillator in accordance with claim 1, wherein the value $C_1$ of said decoupling capacity is linked to the value $R_B$ of the base resistance of the transistor of the two relations $$\frac{LC_1}{RC}=\frac{\alpha C_{b'c}R_B}{R_1^2} \text{ and } C_1=\frac{LC}{R_1R_BC_{b'c}}$$

Where $\alpha$ and $C_{b'c}$ are the respective values corresponding to said second value of said control voltage, of the current gain $$\alpha=-\frac{\Delta I_c}{\Delta I_e}$$

and of the internal base-collector capacitance of the transistor, R, C and L being the characteristics of the oscillating circuit and $R_1$ the biasing resistance of the transistor emitter electrode.

5. Oscillator in accordance with claim 4, wherein said first value of said control voltage applied to the transistor base electrode is selected substantially equal to the biasing voltage of the collector electrode of said transistor by said voltage source and wherein the transistor emitter electrode is connected with a biasing resistance having the value $$R_1=\sqrt{\frac{L}{C}}$$

where L and C are the respective values of the inductance and of the capacitance of said oscillating circuit.

6. Oscillator in accordance with claim 1, including two transistors, wherein a first of said transistors is provided with said oscillating circuit in its collector circuit and with said decoupling capacitance in its emitter circuit, said means for applying said control voltage being adapted to the base electrode of said first transistor and wherein the base electrode of the second transistor is connected with said oscillating circuit through coupling means and the collector electrode of said second transistor is connected with the base electrode of said first transistor, said second transistor constituting a make-up feedback loop which is connected in parallel with the internal base-collector capacitance of said first transistor and contributing to make the oscillator less sensible to load variations in the output circuits connected with the collector of said first transistor.

References Cited

UNITED STATES PATENTS 3,225,313 12/1965 Rexroad ------------ 331—166

JOHN KOMINSKI, Primary Examiner

U.S. Cl. X.R.

331—166, 173